United States Patent [19]

Fuerst

[11] 4,030,792

[45] June 21, 1977

[54] TUNING FORK CONNECTOR

[75] Inventor: Charles Floyd Fuerst, Brooklyn Park, Minn.

[73] Assignee: Fabri-Tek Incorporated, Minneapolis, Minn.

[22] Filed: Mar. 1, 1976

[21] Appl. No.: 662,802

[52] U.S. Cl. ...................... 339/17 LC; 339/176 M; 339/176 MP

[51] Int. Cl.² .......................................... H05K 1/08

[58] Field of Search ........ 339/17 L, 17 LC, 17 LM, 339/176 M, 176 MP

[56] References Cited

UNITED STATES PATENTS

| | | | |
|---|---|---|---|
| 3,136,591 | 6/1964 | Just | 339/176 M |
| 3,351,894 | 11/1967 | Kinkaid | 339/176 M |
| 3,854,788 | 12/1974 | Goodman | 339/176 M |
| 3,865,462 | 2/1975 | Cobaugh | 339/176 M |
| 3,963,293 | 6/1976 | McKee | 339/176 MP |

*Primary Examiner*—Roy Lake
*Assistant Examiner*—Mark S. Bicks

[57] ABSTRACT

An apparatus for connecting blade type male contacts to external circuitry. Tuning fork type female contacts are press fitted into a printed circuit board and an insulative housing is snapped over the top of the contacts. The structure of the insulative housing provides a closed entryway for blade type male contacts to protect the tuning fork contact ends from damage during connection.

5 Claims, 3 Drawing Figures

TUNING FORK CONNECTOR

BACKGROUND OF THE INVENTION

1. Field of the Invention

The invention relates to a tuning fork type female connector for connecting blade type male contacts and more particularly, the invention pertains to both a method for manufacturing a tuning fork type female connector and to the connector so constructed.

2. History the Prior Art

In the past, the majority of tuning fork type female connectors have been assembled by inserting a plurality of individual tuning fork contact and insulator assemblies into a metal plate to form the desired connector pattern. Interconnections between the various contacts were then accomplished by wirewrapped connections from one contact to another. Such connectors and methods of manufacture and expensive and relatively slow.

The invention of the present tuning fork type female connector is constructed by first press fitting or staking tuning fork type contacts into a receiving surface and then attaching an insulative member over the tuning fork type contacts. The receiving surface may be a printed circuit board with plated through holes of a multilayered type, two sided type or single sided type. This assembly technique is much more efficient than that of assembling contacts and insulator combinations into a metal back plane.

SUMMARY OF THE INVENTION

The invention relates to a female connector for blade type male contacts having tuning fork type female contacts inserted in a substrate and an insulative housing snapped over the tuning fork contacts as well as a method of manufacturing such a connector. More particlarly, the invention involves a tuning fork type female connector which includes a mounting board having a plurality of tuning fork contacts mounted therein and an insulative housing covering the contacts. The mounting board would preferably be a printed circuit board. The housing comprises an insulative member with cross shaped entry chambers extending through the bottom of the member to the top to permit it to fit down over and enclose the tuning fork contacts and to allow it to receive blade type contacts inserted through the top.

BRIEF DESCRIPTION OF THE DRAWINGS

For a more complete understanding of the present invention and for further objects and advantages thereof, reference may now be had to the following description taken in conjunction with the accompanying drawings in which.

DETAILED DESCRIPTION

Figure 1:
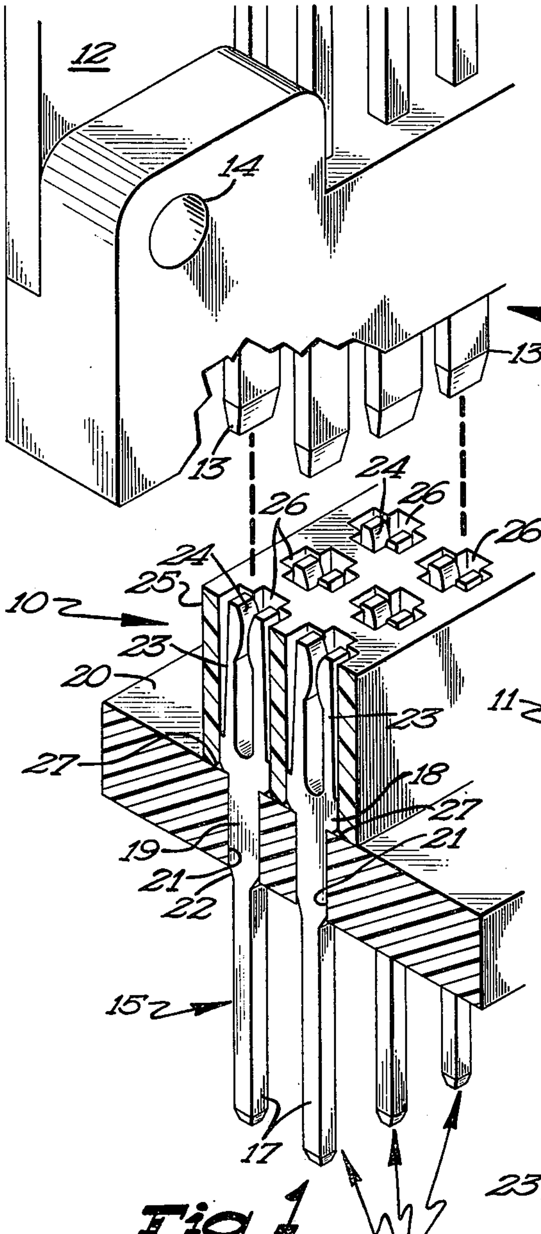
FIG. 1 is a perspective view of the connector of the present invention with a male blade contact assembly aligned for insertion.

Referring to FIG. 1, there is shown a tuning fork connector 10 constructed in accordance with the invention and having a blade type male contact assembly 11 aligned for insertion therein. The blade type male assembly is affixed to a printed circuit board 12 which mounts a number of electrical components (not shown) which are interconnected to one another and to an array of gold plated blade type male contacts 13 by conventional printed circuit techniques. The printed circuit board may be further affixed to the blade type male contact assembly by a rivet through hole 14. The blade type male contacts 13 are electrically connected to those points of the board circuitry which must be interconnected to external circuits. The function of the tuning fork type female connector 10 is to provide electrical connection to the blade type contacts 13 on the board 12. Connections are made by a plurality of conductive metal tuning fork type female contacts 15, one contact for each blade type termination 13.

Figure 2:
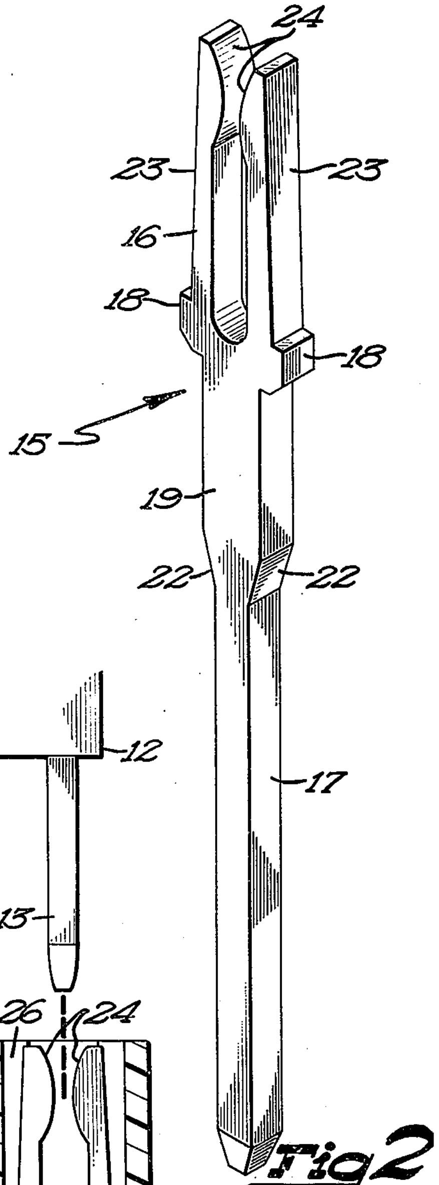
FIG. 2 is a perspective view of one of the tuning fork contacts employed in the connector of the present invention.

Referring now to FIG. 2, one of the tuning fork type female contacts 15 is shown and comprises a connector portion 16 and a shank portion 17 which are separated by a shoulder 18 and a enlarged neck section 19 which is greater in width than the shank. A planar mounting substrate or board 20 upon which the connector is mounted has a plurality of contact receiving holes 21 located at preselected positions. The contact receiving holes 21 are sligthly larger than the shank portion 17 of the contact so that the contact will readily pass into the hole. The neck section 19 of the contact is enlarged to such a width that when a contact is staked or press fitted down into a hole, there is a tight frictional engagement between the neck section 19 and the walls of the hole 21. The shoulder 18 limits the depth to which a contact 15 may be pressed into the board 20. The shank portion 17 of the contact is substantially square in cross-section to permit wiring termination by such techniques as wirewrapping. The leading end of the neck section 19 is chamfered 22 for ease of insertion into the board 20.

The connector portion 16 of the contact 15 is bifurcated into a tuning fork configuration. Each for 23 has a raised portion 24 at its end on its interior facing plane. These juxtaposed raised portions 24 on the forks 23 are spaced apart from one another at a distance which is smaller than the blade type male contact 13 thickness. Insertion of the blade type male contact 13 forces a further separation of the forks 23 to provide a more secure and positive engagement with the blade type male contact 13.

Figure 3:
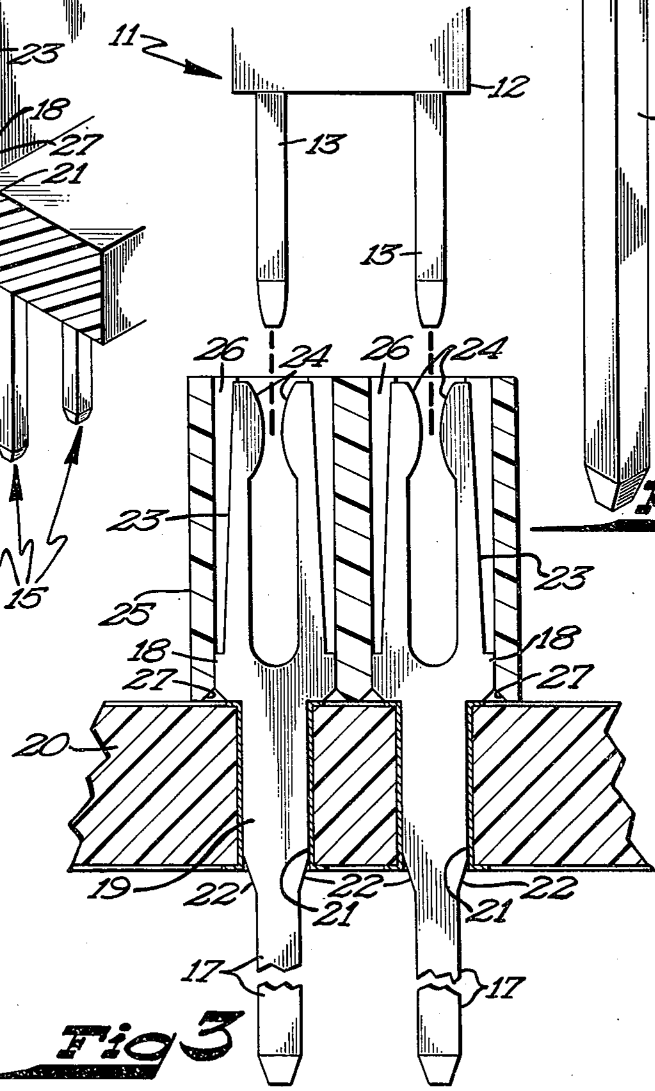
FIG. 3 is a cross-section view of the connector of the present invention with a male blade contact assembly aligned for insertion.

Referring now to FIG. 3, there is shown a cross-section view of the tuning fork contacts 15 after they have been press fitted down into the receiving holes 21 in the mounting board 20 and an insulative housing 25 placed in position over them. The housing 25 is preferably formed of a modable insulative material such as nylon or other plastic which has cross shaped entry chambers 26 at preselected positions extending through the bottom portion of the housing 25 to the upper portion. The width of the cross shaped entry chambers 26 are smaller than the distance between the outermost edge of the shoulders 18 of the tuning fork type female contact 15 at the bottom portion of the housing 25 to frictionally engage the housing 25 to the tuning fork type female contacts 15. Housing 25 may have an entry chamfered 27 at the bottom of its cross shaped entry chamber 26 to allow the housing to be more easily aligned over the tuning fork type female contacts 15 for ease of engagement therewith. The cross shaped entry chambers 26 widen at a point immediately above the shoulders 18 for the remaining distance to the top of the housing 25 to allow for individual tuning fork type female contact removal without removing the entire housing 25. The cross shaped entry chamber perpendicular to the cross shaped entry chamber which holds the tuning fork type female contact 15 accepts the blade type male contact 13 and allows for removal of an individual tuning fork type female contact 15 without the necessity of removing the housing by providing an exit through which the contact 15 may be pushed out.

The tuning fork type female connector is assembled by first inserting all of the tuning fork type female contacts 15 into the receiving holes 21 in the board 20 which is preferably a multilayer board.

Once the tuning fork type female contacts 15 are mounted in the board 20, the insulative housing 25 is placed over the contacts and a downward force is applied to position the housing 25 in contact with the mounting board 20 thereby providing an interference fit between the shoulder 18 of the tuning fork type female contact 15 and the housing 25.

When a blade type male contact 13 is inserted in the cross shaped entry chamber 26, the tuning forks 23 are engaged by the blade type male contact at the raised portion 24. As insertion of the blade contact 13 is continued the tuning forks are pushed farther apart by the blade type male contact 13 providing positive electrical engagement on both sides of the blade contact.

As shown in FIG. 1, the completed tuning fork type female connector is used by inserting a blade type male contact assembly 11 having blade type male contacts 13 thereon into the cross member of the cross shaped entry chambers 26. The tuning forks 23 frictionally engage the blade type male contacts 13 and provide electrical connection to external circuitry (not shown) which is interconnected via the shanks 17 of the tuning fork type female contacts 15 or via the necks 19 which are press fitted into a printed circuit board 20. As can be seen in FIG. 1, the cross shaped entry chambers 26 of the insulative housing 25 prevents accidental damage to the tuning fork type female contacts contained therein.

As can be seen from the description of th method used in assembling the tuning fork type female connector of the present invention, it is much simpler to first insert the terminals into a receiving surface and then snap the insulative housing over the top than it is to individually place the terminals into a receiving insulative housing.

Having described the invention with certain specific embodiments thereof, it is to be understood that further modifications may now suggest themseleves to those skilled in the art and it is intended to cover such modifications as fall within the scope of the appended claims.

What I claim is:

1. A female connector for connection to blade type male contacts, comprising:

a. a planar mounting substrate;

b. said planar mounting substrate containing a plurality of receiving holes;

c. a plurality of female contacts, each of said female contacts including a neck portion and a connector portion, each of said female contacts being press-fitted into a corresponding one of each of said receiving holes with said neck portion of each of said female contacts abutting the walls of a corresponding one of said receiving holes into which it is inserted;

d. an insulative housing covering each of said female contacts at least partially, said insulative housing containing a plurality of entry chambers, each of said entry chambers having a bottom portion and a top portion;

e. each of said entry chambers extending individually through said insulative housing and having a cross-shaped cross section in planes parallel to said mounting substrate with each of said cross sections being comprised to two intersecting cross members with one of said cross member being sized to accommodate the width of one of said female contacts inserted therein, and the other cross member being sized to accommodate the width of a male contact blade which may be inserted therein;

f. each of said entry chambers having isoplanar walls along its length to allow said insulative housing to forceably slide over said female contacts generally without interference with the contour of each of said female contacts which would prevent such sliding; and g. the diameter of each of said entry chambers being generally the same as th diameter of corresponding ones of said female contacts to allow each of said female contacts to be removed individually through the top or bottom portion of each corresponding one of said entry chambers into which it is inserted.

2. The female connector of claim 1 wherein each of said female contacts is a tuning fork type contact having a bifurcated connector portion for receiving a blade type male contact therein.

3. A female connector for blade type male contacts, comprising:

a. a planar mounting substrate having a top surface;

b. said substrate containing a plurality of receiving holes, each of said receiving holes having opposed walls;

c. a plurality of female contacts, each of said female contacts being inserted in one of said receiving holes and each of said female contacts including:

i. a shank portion;

ii. a neck portion;

iii. a shoulder portion;

iv. a connector portion;

d. each of said female contact neck portions having a diameter greater than the diameter of the one of said receiving holes into which it is inserted, and abutting the opposed walls of the one of said receiving holes to allow each of said female contacts to be frictionally retained therein;

e. each of said female contact shoulder portions being in abutting engagement with the top surface of said mounting substrate when each of said female contacts is inserted in one of said receiving holes;

f. an insulative housing for at least partially enclosing each of said female contacts, said insulative housing containing a plurality of entry chambers extending therethrough, each of said entry chambers corresponding with one of said female contacts and having a bottom portion, a top portion and opposed walls;

g. each of said entry chambers having a cross-shaped cross section in planes parallel to said mounting substrate, each of said entry chamber cross sections being defined by first and second intersecting cross members;

h. the diameter of one of each of said entry chamber cross members being smaller than the diameter of the one of said female contact shoulder portions inserted therein at the entry chamber bottom portion to provide friction engagement between the one of said female contacts and said insulative housing; and i. the width of the top portion of each of said entry chambers being generally greater than the width of a corresponding one of said female contacts to allow the corresponding one of said female contacts to be individually removed therefrom without separating said insulative housing from said mounting substrate.

4. The female connector of claim 3 wherein the walls of each of said entry chamber are generally isoplanar along their length to allow said insulative housing to be slideably moveable over said plurality of female contacts to emplace it over said plurality of female contacts or to remove it therefrom without deforming any of said female contacts.

5. The female connector of claim 3 wherein each of said female contacts is a tuning fork type contact having a bifurcated connector portion for receiving a blade type male contact therein through a corresponding one of said entry chambers.

* * * * *